US008788112B2

(12) United States Patent
Schusser et al.

(10) Patent No.: US 8,788,112 B2
(45) Date of Patent: Jul. 22, 2014

(54) PROCESS FOR CONTROLLING FUNCTIONS IN A MOTOR VEHICLE HAVING NEIGHBORING OPERATING ELEMENTS

(75) Inventors: Peter Schusser, Mammendorf (DE); Bernhard Niedermaier, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 338 days.

(21) Appl. No.: 12/967,484

(22) Filed: Dec. 14, 2010

(65) Prior Publication Data

US 2011/0082603 A1 Apr. 7, 2011

Related U.S. Application Data

(63) Continuation of application No. PCT/EP2009/004039, filed on Jun. 5, 2009.

(30) Foreign Application Priority Data

Jun. 20, 2008 (DE) ........................ 10 2008 029 446

(51) Int. Cl.
*G06F 19/00* (2011.01)

(52) U.S. Cl.
USPC .................................. 701/1; 701/36; 701/49

(58) Field of Classification Search
None
See application file for complete search history.

(56) References Cited

U.S. PATENT DOCUMENTS 5,565,894 A * 10/1996 Bates et al. .................. 345/178
5,627,567 A * 5/1997 Davidson ..................... 345/173
5,692,186 A * 11/1997 Fukuoka et al. ..................... 1/1
5,818,451 A * 10/1998 Bertram et al. .............. 715/840
5,877,751 A * 3/1999 Kanemitsu et al. .......... 345/173
6,154,201 A * 11/2000 Levin et al. .................. 345/184
6,154,688 A * 11/2000 Dominke et al. ................ 701/1
6,256,021 B1 * 7/2001 Singh ........................... 345/173
6,256,558 B1 * 7/2001 Sugiura et al. ................... 701/1
6,470,252 B2 * 10/2002 Tashiro et al. ................. 701/51
6,553,297 B2 * 4/2003 Tashiro et al. ................. 701/48
6,580,974 B2 * 6/2003 Haag et al. ....................... 701/1
6,810,314 B2 * 10/2004 Tashiro et al. ................. 701/48
6,862,508 B2 * 3/2005 Akiyama et al. ............... 701/48
6,901,350 B2 * 5/2005 Loehr et al. .................. 702/186
6,901,910 B2 * 6/2005 Hess et al. ................... 123/436

(Continued)

FOREIGN PATENT DOCUMENTS

DE 100 23 783 A1 11/2001
DE 699 02 290 T2 2/2003
DE 10 2006 054 075 A1 6/2007
DE 10 2007 024 455 A1 12/2007

OTHER PUBLICATIONS

German Search Report dated Nov. 27, 2008 including partial English-language translation (Nine (9) pages).

(Continued)

*Primary Examiner* — Jonathan M Dager
(74) *Attorney, Agent, or Firm* — Crowell & Moring LLP

(57) ABSTRACT

In the case of the process for controlling functions in a motor vehicle having neighboring operating elements, the functions in each case being activatable by the operation of a defined operating element assigned to each function, the functions assigned to two neighboring operating elements receive a different priority. The higher-priority function can be activated immediately if the operating element assigned to it is operated before or within a defined time period after the neighboring other operating element.

8 Claims, 1 Drawing Sheet

R
B1
1
2
3
<
>
(B2)
(B1)
B2

(56) References Cited

U.S. PATENT DOCUMENTS

| | | | | |
|---|---|---|---|---|
| 6,957,128 | B1 * | 10/2005 | Ito et al. | 701/1 |
| 6,985,137 | B2 * | 1/2006 | Kaikuranta | 345/175 |
| 7,032,981 | B2 * | 4/2006 | Frey et al. | 303/15 |
| 7,047,117 | B2 * | 5/2006 | Akiyama et al. | 701/48 |
| 7,103,852 | B2 * | 9/2006 | Kairis, Jr. | 715/800 |
| 7,126,583 | B1 * | 10/2006 | Breed | 345/158 |
| 7,139,650 | B2 * | 11/2006 | Lubischer | 701/48 |
| 7,162,333 | B2 * | 1/2007 | Koibuchi et al. | 701/1 |
| 7,489,303 | B1 * | 2/2009 | Pryor | 345/173 |
| 7,529,601 | B2 * | 5/2009 | Kaigawa et al. | 701/1 |
| 7,580,820 | B2 * | 8/2009 | Sawada | 703/8 |
| 7,689,337 | B2 * | 3/2010 | Post, II | 701/48 |
| 7,720,586 | B2 * | 5/2010 | Harumoto et al. | 701/48 |
| 7,770,187 | B2 | 8/2010 | Letellier et al. | |
| 7,903,092 | B2 * | 3/2011 | Philipp | 345/173 |
| 8,026,902 | B2 * | 9/2011 | Medler et al. | 345/173 |
| 8,078,363 | B2 * | 12/2011 | Sakane | 701/48 |
| 8,160,781 | B2 * | 4/2012 | Naono et al. | 701/48 |
| 8,237,686 | B2 * | 8/2012 | Yoneji | 345/184 |
| 8,446,381 | B2 * | 5/2013 | Molard et al. | 345/173 |
| 8,456,445 | B2 * | 6/2013 | De Mers et al. | 345/174 |
| 8,656,208 | B2 * | 2/2014 | Hong et al. | 714/4.1 |
| 2003/0222858 | A1 * | 12/2003 | Kobayashi | 345/173 |
| 2003/0225496 | A1 * | 12/2003 | Coelingh et al. | 701/48 |
| 2004/0044443 | A1 * | 3/2004 | Eriksson | 701/1 |
| 2004/0140913 | A1 * | 7/2004 | Engelmann et al. | 341/22 |
| 2004/0183833 | A1 * | 9/2004 | Chua | 345/773 |
| 2005/0001472 | A1 * | 1/2005 | Bale et al. | 303/20 |
| 2005/0004723 | A1 * | 1/2005 | Duggan et al. | 701/24 |
| 2005/0165513 | A1 * | 7/2005 | Obradovich | 701/1 |
| 2006/0173615 | A1 * | 8/2006 | Pinkus et al. | 701/211 |
| 2006/0287787 | A1 * | 12/2006 | Engstrom et al. | 701/36 |
| 2007/0052545 | A1 * | 3/2007 | Le Gallic | 340/815.4 |
| 2007/0164604 | A1 * | 7/2007 | Bale et al. | 303/20 |
| 2007/0252552 | A1 * | 11/2007 | Walrath | 320/107 |
| 2007/0273561 | A1 * | 11/2007 | Philipp | 341/33 |
| 2007/0287494 | A1 * | 12/2007 | You et al. | 455/550.1 |
| 2008/0172633 | A1 * | 7/2008 | Jeon et al. | 715/810 |
| 2008/0186282 | A1 * | 8/2008 | Nix et al. | 345/173 |
| 2009/0150814 | A1 * | 6/2009 | Eyer et al. | 715/765 |
| 2009/0195513 | A1 * | 8/2009 | Dybalski et al. | 345/173 |
| 2009/0206660 | A1 * | 8/2009 | Makita et al. | 307/9.1 |
| 2009/0273575 | A1 * | 11/2009 | Pryor | 345/173 |
| 2010/0289633 | A1 * | 11/2010 | Aryal et al. | 340/441 |
| 2011/0029185 | A1 * | 2/2011 | Aoki et al. | 701/29 |
| 2011/0082620 | A1 * | 4/2011 | Small et al. | 701/29 |
| 2011/0246891 | A1 * | 10/2011 | Schubert et al. | 715/719 |
| 2011/0278920 | A1 * | 11/2011 | Sakamoto et al. | 307/10.1 |
| 2012/0268409 | A1 * | 10/2012 | Soo et al. | 345/173 |

OTHER PUBLICATIONS

International Search Report dated Sep. 23, 2009 including English-language translation (Four (4) pages).

* cited by examiner

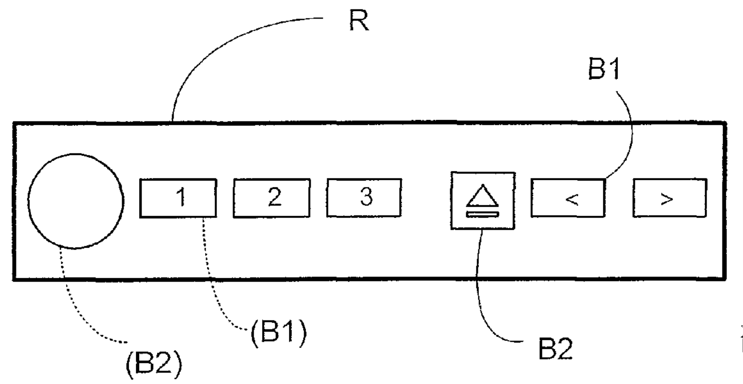
Figure 1
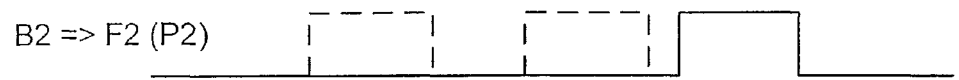
B2 => F2 (P2)
Fig 2A
B1 => F1 (P1)
B2 => F2 (P2)
Δt
t
Fig 2B
B1 => F1 (P1)
B2 => F2 (P2)
Δt
t
Fig 2C

PROCESS FOR CONTROLLING FUNCTIONS IN A MOTOR VEHICLE HAVING NEIGHBORING OPERATING ELEMENTS

CROSS-REFERENCE TO RELATED APPLICATIONS

This application is a continuation of PCT International Application No. PCT/EP2009/004039, filed Jun. 5, 2009, which claims priority under 35 U.S.C. §119 to German Patent Application No. DE 10 2008 029 446.2, filed Jun. 20, 2008, the entire disclosures of which are herein expressly incorporated by reference.

BACKGROUND AND SUMMARY OF THE INVENTION

The invention relates to a process for controlling functions in a motor vehicle having neighboring operating elements, the functions in each case being activatable by the operation of a defined operating element assigned to each function.

From German Patent document DE 10 2007 024 455 A1, a process is known for the selection of an operated key from a capacitive keyboard having keys situated closely side-by-side. Keying ambiguities may occur particularly in the case of capacitive keyboards, which are operated in a non-contact manner, if the keys are not operated precisely in the center. Here, German Patent document DE 10 2007 024 455 A1 teaches the analysis of the intensity of the key signal outputs in combination with the prioritization of keys.

It is an object of the invention to further develop a process of the above-mentioned type in view of the recognition of an unintended operation of neighboring operating elements.

According to the invention, this and other objects are achieved by a process for controlling functions in a motor vehicle having neighboring operating elements, the functions in each case being activatable by the operation of a defined operating element assigned to each function. The functions assigned to two neighboring operating elements receive a different priority. The higher-priority function is activatable immediately if the operating element assigned to it is operated before the neighboring other operating element.

In the case of the process according to the invention for controlling functions in a motor vehicle having neighboring operating elements, the functions in each case being activatable by the operation of a defined operating element assigned to each function, the functions assigned to two neighboring operating elements receive a different priority. The higher-priority function will be activated immediately if the operating element assigned to it is operated before the neighboring other operating element to which the lower-priority function is assigned. Thus, the operation of the operating element to which the lower-priority function is assigned will be ignored until the operation of the operating element to which the higher-priority function is assigned has been concluded.

Preferably, the lower-priority function will be activated only if the operating element to which the higher-priority function is assigned is not operated within a predefined time window starting from the operation of the operating element to which the lower-priority function is assigned. Otherwise, the higher-priority function will be activated.

Furthermore, the operation of the operating element to which the lower-priority function is assigned will preferably be ignored when it occurs during the operation of the operating element to which the higher-priority function is assigned.

This invention is particularly suitable for keys situated relatively closely together and for small keys and/or rotary switches in the passenger compartment of a motor vehicle.

Other objects, advantages and novel features of the present invention will become apparent from the following detailed description of one or more preferred embodiments when considered in conjunction with the accompanying drawings.

BRIEF DESCRIPTION OF THE DRAWING

FIG. 1 is a schematic drawing illustrating an embodiment of the invention; and FIGS. 2A-2C are three time dependent diagrams illustrating an exemplary operation of the invention.

DETAILED DESCRIPTION OF THE DRAWINGS

FIG. 1 is a schematic view of vehicle component having neighboring operating elements, and FIGS. 2A-2C are conceivable time sequences of operations of two neighboring operating elements with the pertaining reactions according to an exemplary embodiment of the invention.

The neighboring operating elements B1 and B2 may, for example, be two keys B1, B2 situated directly side-by-side or a button (B1) and a rotary switch (B2) situated directly next to the button (B1) of a radio R in a motor vehicle (not shown). The exemplary process is carried out, for example, by a software program stored in the radio R. In the example described in detail, the operating element B1 is to be a selector key for pieces of music (<, in the reverse search direction) in the CD operation. The operating element B2 is to be the CD-eject key. Function F1 is therefore the selection of the respectively preceding piece of music or the search run in the reverse direction. Function F2 is the sliding-out of the CD. Function F1 has the higher priority P1. Function F2 has the lower priority P2. The reason is that an unintended sliding-out of a CD requires a longer correction time. The function which, in a doubtful situation, should rather not be activated therefore receives the lower priority P2.

FIGS. 2A-2C illustrate three time dependency diagrams. Operations of the operating elements indicated by a broken line signify that they are ignored according to the invention.

In the upper time dependency diagram of FIG. 2A, the higher-priority P1 function F1 will be activated immediately if the operating element B1 assigned to it is operated before the neighboring other operating element B2. The operation of the operating element B2 will be ignored; function F2 will not be executed. The operation of the operating element B2 will be ignored until the operation of the operating element B2 starts after the operation of the operating element B1 has been concluded. Thus, the operation of the operating element B2 will be ignored if it occurs during the operation of the operating element B1.

The lower-priority P2 function F2 will be activated only if the operating element B1 is not operated within a predefined time window Δt starting from the operation of the operating element B2. Accordingly, the operation of the operating element B2 is ignored in the center diagram of FIG. 2B. Function F2 is therefore executed in the lower diagram of FIG. 2C.

Furthermore, it is illustrated in the lower diagram of FIG. 2C, that function F1 is not executed simultaneously with function F2. Function F1 will only be executed when function F2 has been concluded or at least when the operation of the operating element B2 has been concluded before the operating element B1 is operated.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A process for controlling functions of a vehicle component in a motor vehicle having neighboring operating elements, the functions in each case being activatable by operation of a defined user-selectable operating element assigned to each function, the process comprising the acts of:

associating, by the vehicle component, different priorities to functions respectively assigned to two neighboring user-selectable operating elements based on the two neighboring user-selectable operating elements being in proximity to each other;

activating immediately, by the vehicle component, a higher-priority function if the user-selectable operating element assigned to such higher-priority function is operated before a neighboring other operating element; and avoiding an unintended operation of one of the neighboring operating elements by ignoring the operation of the user-selectable operating element with the lower-priority function if operation of said user-selectable operating element occurs during the operation of the user-selectable operating element having the higher-priority function.

2. The process according to claim 1, further comprising the act of:

activating, by the vehicle component, a lower-priority function only if the user-selectable operating element associated with the higher-priority function is not operated within a predefined time period beginning from the operation of the user-selectable operating element having assigned to it the lower-priority function.

3. A function control process of a vehicle component having different user-selectable operating elements in a passenger compartment of the motor vehicle in close proximity to one another, wherein each user-selectable operating element is configured to carry out respective functions in response to being actuated by a user, the process comprising the acts of:

assigning, by the vehicle component, a higher-priority to a respective function of one user-selectable operating element based on a proximity to another user-selectable operating element;

assigning, by the vehicle component, a lower-priority to a respective function of the another user-selectable operating element;

activating, by the vehicle component, the higher-priority function immediately upon the one user-selectable operating element receiving an operating input from the user before said other user-selectable operating element receives such operating input from the user; and avoiding an unintended operation of the neighboring operating elements by ignoring receipt of such operating input by the other user-selectable operating element if said operating input occurs during activation of the higher-priority function.

4. The process according to claim 3, further comprising the acts of:

activating, by the vehicle component, the lower-priority function only if the one user-selectable operating element does not receive such operating input within a predefined time period starting from receipt of such operating input by the other user-selectable operating element.

5. The process according to claim 1, wherein the user-selectable operating elements comprise at least one of a key and a rotary switch in the passenger compartment of the motor vehicle.

6. The process according to claim 5, wherein the at least one of the key and the rotary switch correspond to a radio of the motor vehicle.

7. The process according to claim 3, wherein the one user-selectable operating element and the another user-selectable operating element comprise at least one of a key and a rotary switch in the passenger compartment of the motor vehicle.

8. The process according to claim 7, wherein the at least one of the key and the rotary switch correspond to a radio of the motor vehicle.

* * * * *